United States Patent
Takai

(10) Patent No.: US 7,073,015 B2
(45) Date of Patent: Jul. 4, 2006

(54) INFORMATION STORAGE APPARATUS

(75) Inventor: Yoriharu Takai, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 273 days.

(21) Appl. No.: 10/391,422

(22) Filed: Mar. 19, 2003

(65) Prior Publication Data

US 2003/0182497 A1    Sep. 25, 2003

(30) Foreign Application Priority Data

Mar. 20, 2002    (JP)    ............................... 2002-079299

(51) Int. Cl.
*G06F 12/00*    (2006.01)
(52) U.S. Cl. ...................... 711/103; 711/102
(58) Field of Classification Search ................ 711/103, 711/102; 365/185.29, 189.07
See application file for complete search history.

(56) References Cited

U.S. PATENT DOCUMENTS

| | | | |
|---|---|---|---|
| 5,034,922 A * | 7/1991 | Burgess | 365/189.07 |
| 5,936,884 A | 8/1999 | Hasbun et al. | |
| 6,069,827 A * | 5/2000 | Sinclair | 365/185.29 |
| 6,145,051 A | 11/2000 | Estakhri et al. | |
| 6,427,186 B1 * | 7/2002 | Lin et al. | 711/103 |

FOREIGN PATENT DOCUMENTS

| | | |
|---|---|---|
| JP | 2000-148569 | 5/2000 |
| JP | 2001-195889 | 7/2001 |
| JP | 2002-52416 | 2/2002 |

* cited by examiner

*Primary Examiner*—Mano Padmanabhan
*Assistant Examiner*—Mardochee Chery
(74) *Attorney, Agent, or Firm*—Oblon, Spivak, McClelland, Maier & Neustadt, P.C.

(57) ABSTRACT

According to the present invention, there is provided an information storage apparatus having a non-volatile memory device in which a data erase block is larger than a data write block, the apparatus comprising erase means for effecting erase in the non-volatile memory device on the basis of a write command from a host, a clean block pointer that stores an address of an erase area in the non-volatile memory device, which is erased by the erase means, and information indicative of a position of a write block in the erase area, up to which data is written, determination means for determining, based on the clean block pointer, whether data associated with the write command is writable in the erase area in the non-volatile memory device, which is erased by the erase means, and write means for writing the data associated with the write command in the erase area, when the determination means determined that the data is writable.

12 Claims, 6 Drawing Sheets

Clean block pointer

Erase block address → 0X1000 — 1-4a
Write enable pointer → 0X03

Write prohibit / Write OK

Non-volatile memory device 1-6

0X1000 Erase block
0X0 Data
0X1 Data
0X2 Data
0X3

X Erase block
1 write block
Data
Data — 1 erase block
Data

FIG. 2

Erase start
↓
Erase — S1
↓
CBP-Addr=Erase block — S2
↓
CBP-Wp=0 — S3
↓
Erase end

FIG. 4

INFORMATION STORAGE APPARATUS

CROSS-REFERENCE TO RELATED APPLICATIONS

This application is based upon and claims the benefit of priority from the prior Japanese Patent Application No. 2002-079299, filed Mar. 20, 2002, the entire contents of which are incorporated herein by reference.

BACKGROUND OF THE INVENTION

1. Field of the Invention

The present invention relates to an information storage apparatus, and more particularly to a memory card such as an SD (Secure Digital) memory card.

2. Description of the Related Art

There is a non-volatile memory device, represented by a flash memory, wherein a minimum erase unit (data erase block) is greater than a minimum write unit (data write block). When additional write is to be executed in this type of non-volatile memory device, an operation for shifting existing data, as well as a data write operation, is performed.

In the data shift operation, an area of a new data erase block is prepared in the non-volatile memory device, data is copied in the area and also additional write data is written in the area.

The "data shift operation" will now be described in greater detail.

The data shift operation is performed in a non-volatile memory device, such as a NAND type flash memory or an AND type flash memory, wherein a data bit is writable only in one direction of "1→0" or "0→1".

In the NAND type flash memory, for instance, data is writable only in one direction of "1→0". Even if "1" is to be written in an area with data "0", "1" cannot be written and data "0" remains.

Unless all area for write in the non-volatile memory device have initial values "1", there may be a case where data to be written does not coincide with data actually written. The sole method for setting data values "1" in the all area is to issue an erase command to the addresses of the area.

Assume that the host has issued a first command for new write of 8 KB data, and a second command for write (additional write) of 8 KB data following the new write of 8 KB data. Since the second command relates to the additional write, additional data write is attempted in the area in the non-volatile memory device. However, it is not sure whether data in the area is "1" (i.e. data after erase), and it is possible that data to be written does not coincide with data actually written.

To avoid this problem, new write area is prepared as a substitute for the above area for additional write. The new write area is first erased, thereby the new write area with values "1" are created. Then, the existing data is copied in the new write blocks.

Thereafter, additional write data from the host is written, and the previously used write area is invalidated. This process is required for shifting the existing data.

The flash memory is advantageous in that it is non-volatile and rewritable. However, in some cases, physical overwrite is prohibited. In addition, in general, the erase/write speed is slower than the read speed.

Furthermore, in the case where the minimum erase unit is larger than the minimum read/write unit, it is necessary to copy or erase the existing data in the flash memory, as represented by "existing data shift operation", even when only data in a partial area needs to be rewritten. Thus, there are many necessary operations, and the write operation speed cannot be increased.

BRIEF SUMMARY OF THE INVENTION

According to an aspect of the present invention, there is provided an information storage apparatus having a non-volatile memory device in which a data erase block is larger than a data write block, the apparatus comprising erase means for effecting erase in the non-volatile memory device on the basis of a write command from a host, a clean block pointer that stores an address of an erase area in the non-volatile memory device, which is erased by the erase means, and information indicative of a position of a write block in the erase area, up to which data is written, determination means for determining, based on the clean block pointer, whether data associated with the write command is writable in the erase area in the non-volatile memory device, which is erased by the erase means, and write means for writing the data associated with the write command in the erase area, when the determination means determined that the data is writable.

BRIEF DESCRIPTION OF THE SEVERAL VIEWS OF THE DRAWING

FIG. 2 shows the structure of a clean block pointer;

FIG. 4 is a flow chart illustrating a process at the time of erase;

DETAILED DESCRIPTION OF THE INVENTION

An information storage apparatus according to one aspect of the present invention will now be described with reference to the accompanying drawings.

Figure 1:
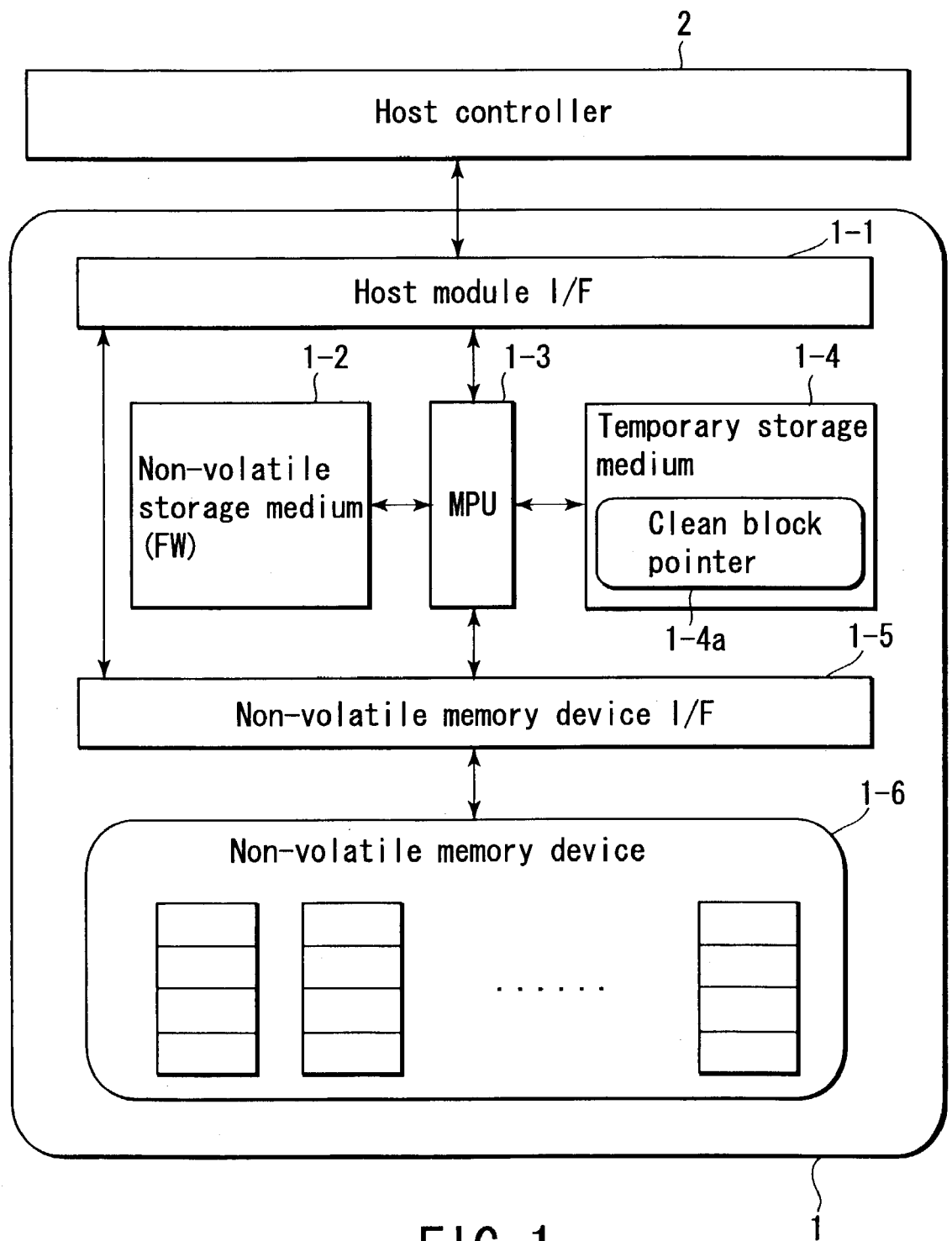
FIG. 1 shows an information storage apparatus according to an embodiment of the present invention.

FIG. 1 shows an information storage apparatus according to an embodiment of the present invention.

As is shown in FIG. 1, an information storage apparatus 1 of this embodiment comprises a host module interface 1-1, a non-volatile storage medium 1-2, an MPU 1-3, a temporary storage medium 1-4, an interface 1-5 for a non-volatile memory device (hereinafter referred to as "non-volatile memory device interface 1-5"), and a non-volatile memory device 1-6.

The host module interface 1-1 transmits/receives information to/from the host controller 2.

The non-volatile storage medium 1-2 stores firmware for controlling the MPU 1-3.

The MPU 1-3 controls a write operation of the information storage apparatus according to the embodiment of the invention. In addition, the MPU 1-3 controls the entirety of the information storage apparatus. Based on a program stored in the non-volatile storage medium 1-2, the MPU 1-3 interprets a request from the host controller 2 and accesses the non-volatile memory device 1-6, for example, issues commands and transfers data.

The temporary storage medium 1-4 is a working area of the MPU 1-3. The temporary storage medium 1-4 is used not only to temporarily store data in writing/reading it in/from the non-volatile memory device 1-6, but also to store variables necessary for access to the non-volatile memory device 1-6 or the host controller 2. In addition, the temporary storage medium 1-4 stores a clean block pointer 1-4a that is used in the information storage apparatus of this embodiment. The specific structure of the clean block pointer 1-4a will be described later.

The non-volatile memory device interface 1-5 performs transmission/reception of information between the non-volatile memory device 1-6, on the one hand, and the MPU 1-3 and host controller 2, on the other.

The host controller 2 is a unit for performing access operations, such as read, write and erase, for the storage apparatus 1. The host controller 2 is a personal computer, for instance.

The operation of the information storage apparatus according to the embodiment of this invention will now be described.

When a read command has been issued from the host controller 2, the MPU 1-3 interprets a read address and issues a read command to the non-volatile memory device 1-6 via the non-volatile memory device interface 1-5, using the temporary storage medium 1-4 as a working area. Data read out of the non-volatile storage device 1-6 is stored in the temporary storage medium 1-4 and then delivered to the host controller 2 under control of the MPU 1-3.

When a write command has been issued from the host controller 2, the MPU 1-3 interprets a write address and stores write data in the temporary storage medium 1-4. Then, the MPU 1-3 issues a write command to the non-volatile memory device 1-6 via the non-volatile memory device interface 1-5, thus performing a write operation.

The temporary storage medium 1-4 stores variables called "clean block pointer". Thus, the temporary storage medium 1-4 has a function necessary for effectively processing write data delivered from the host controller.

FIG. 2 shows the structure of the clean block pointer.

The clean block pointer 1-4a comprises a data erase block address and a write enable pointer. The clean block pointer 1-4a indicates that data can be written in an area beginning with the block indicated by the write enable pointer of the associated erase block address.

In the example of FIG. 2, information "0x1000" is described as the erase block address in the clean block pointer, and information "0x003" is described as the write enable pointer. This means that the first three write blocks are prohibited from data write since data has already been written therein.

A description will now be given of a case where data is additionally written in a non-volatile storage apparatus in which a data erase block is greater in size than a data read/write block.

In this embodiment, it is assumed that a data erase block is 16 KB and a data read/write block is 8 KB, and a command for 8 KB data write has been issued twice from the host controller.

Figure 3:
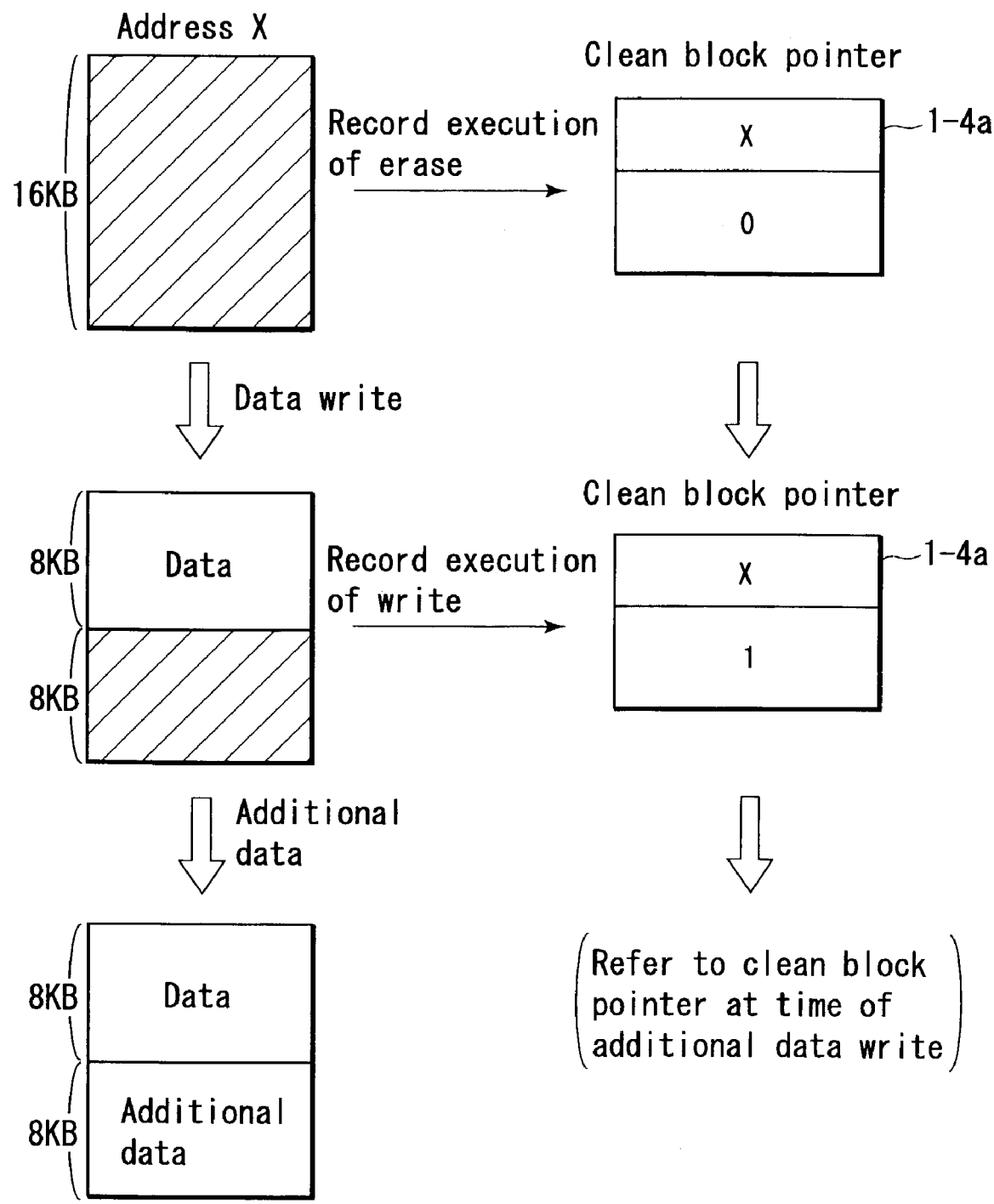
FIG. 3 shows the relationship between data written in a non-volatile memory device and the clean block pointer.
Figure 5:
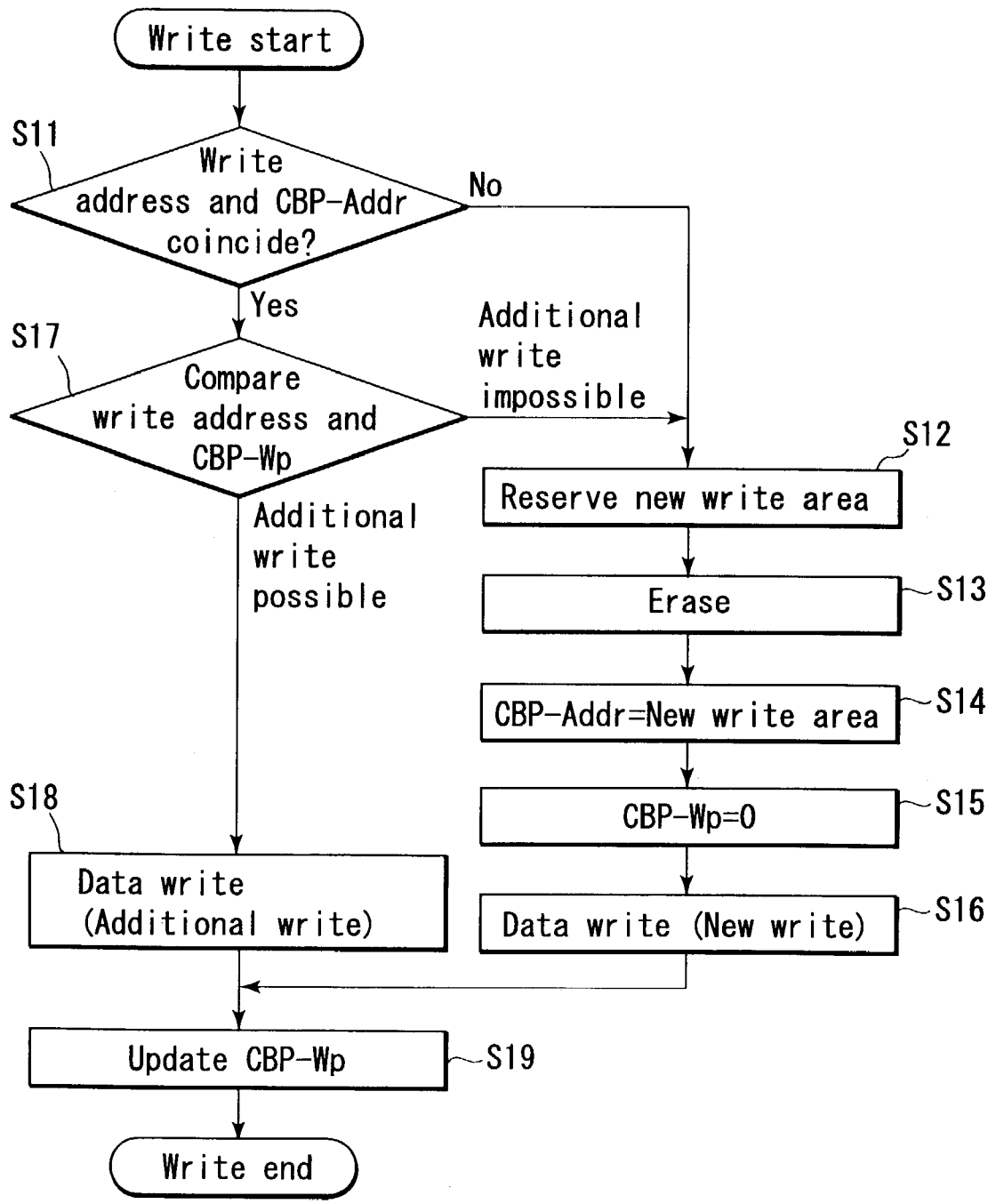
FIG. 5 is a flow chart illustrating a data write operation.

FIG. 3 shows a relationship between data written in the non-volatile storage apparatus and the clean block pointer. FIG. 4 is a flow chart illustrating a process at the time of erase. FIG. 5 is a flow chart illustrating a data write operation.

If a new write command for 8 KB data has been issued from the host controller, the MPU 1-3 performs an erase operation, according to a conventional method, in the non-volatile storage apparatus, thereby reserving an area for data write. Thus, a writable area is formed (FIG. 4: S1). At this time, the clean block pointer stored in the temporary storage medium is updated (FIG. 4: S2, S3).

If an erase block with address X has been erased, "X" is described as the erase block address (CBP-Addr) in the clean block pointer, and "0" is described as the write enable pointer (CBP-Wp). Thus, the erase process is completed.

Next, a write process will be described referring to FIG. 5

To begin with, it is determined whether the write address of the write command coincides with the erase block address (S11). If no coincidence is determined in step S11, a new write area is reserved (S12) and an erase process is executed for the new write area (S13).

Subsequently, the address of the new write area is stored as the erase block address in the clean block pointer (S14), and "0" is stored as the write enable pointer (S15). Then, data write is executed (S16) and the write enable pointer is updated (S19).

On the other hand, if coincidence between the write address of the write command and the erase block address is determined in step S11, the write address is compared with the write enable pointer (S17).

In this embodiment, it is assumed that one erase block is 16 KB and one write block is 8 KB. Thus, if the write enable pointer indicates the second block from the erase block address, it is determined that additional write cannot be performed.

If the comparison result in step S17 shows that additional write is impossible, control goes to step S12. On the other hand, if it is determined that additional write is possible, data is additionally written (S18), and the write enable pointer is updated (S19).

According to the information storage apparatus of the present embodiment, the possibility/impossibility of write in a write area can be determined by referring to the associated clean block point. If the write area is writable, 8 KB data is written in the block.

At the same time, information about the write block, up to which data has been written, is recorded in the clean block pointer. Thereby, it is indicated that blocks other than the first 8 KB are writable. In this embodiment, since 8 KB=1 write block, "1" is described in the clean block pointer.

If another write command has been issued to write (additionally write) 8 KB data at the subsequent address, the write address is compared with the clean block pointer. If it is confirmed that additional write is possible, data is additionally written in the area without performing a data shift operation. In these procedures, the memory area to be used is one erase block, and one erase operation and two write operations are needed.

In the example shown in FIG. 3, compared to the conventional method, the memory area to be used can be reduced by one erase block, and also one erase operation, one write operation and one invalidation process can be made needless.

As has been described above, in the embodiment of the present invention, a plurality of write commands are issued.

If these commands are associated with additional write in an area in the same erase block, the number of operations for accessing the non-volatile memory device can be reduced and high-speed operations can be achieved.

ANOTHER EMBODIMENT

An information storage apparatus according to another embodiment of the present invention will now be described.

In the above-described embodiment, one clean block pointer is used. By contrast, in the present embodiment, a plurality of clean block pointers are provided in the temporary storage medium.

Figures 6A, 6B, 6C:
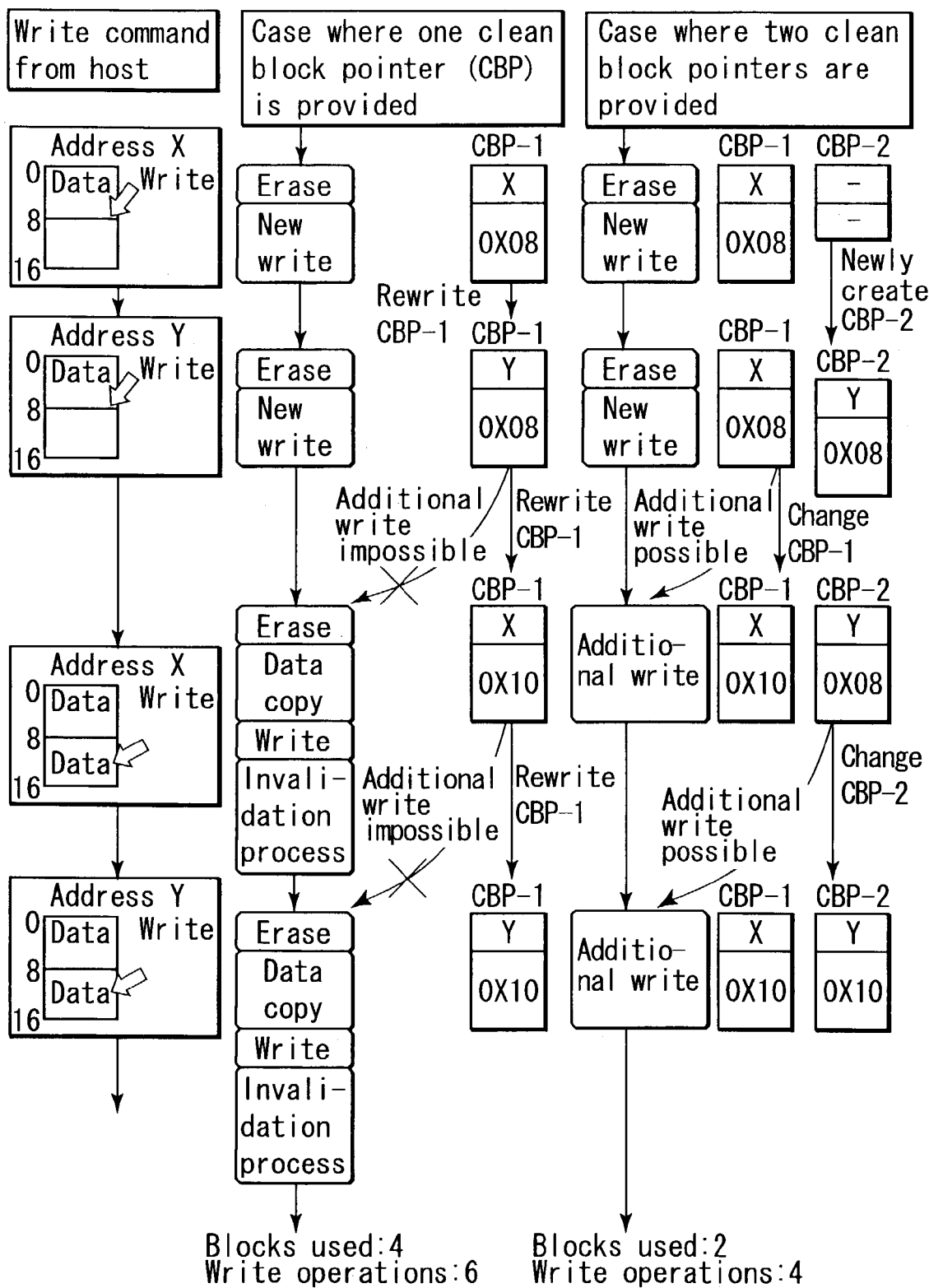
FIG. 6A shows write commands from a host controller.
FIG. 6B illustrates the operation of the information storage apparatus in the case where one clean block pointer is provided.
FIG. 6C illustrates the operation of the information storage apparatus in the case where two clean block pointers are provided.

Assume that write commands from the host controller have been issued alternately in association with two areas, as shown in FIG. 6A.

FIG. 6B is a view for explaining the operation of the information storage apparatus in the case where one clean block pointer is used, and FIG. 6C is a view for explaining the operation of the information storage apparatus in the case where two clean block pointers are used.

In FIG. 6C, the clean block pointers CBP-1 and CBP-2 are values indicative of clean block pointers stored in the temporary storage medium. The upper part of each pointer is an erase block address (CBP-Addr), and the lower part is a write enable pointer (CBP-Wp).

As is shown in FIG. 6B, if write commands are issued to an address X and an address Y in the case where only one clean block pointer is provided, the clean block pointer for the address X is updated at the same time the write operation for the address Y has been performed, and the information on the clean block pointer for the address X is lost.

Thus, even if an additional write command has been issued for the address X, it is not determined whether the area for additional write is writable or not, and it is necessary to perform a data shift operation as in the prior art. This procedure is the same as in the case where no clean block point is provided, and there is no advantage.

In the information storage apparatus of this another embodiment, two clean block pointers are provided, and these pointers (CBP-1, CBP-2) are alternately used. FIG. 6C is a view for explaining the operation of the information storage apparatus in the case where two clean block pointers are provided.

If a write command has been issued for the address X, the write pointer information is stored in the CBP-1. If a write command has been issued for the address Y, the write pointer information is stored in the CBP-2. In this another embodiment, since the two clean block pointers are provided, information on both addresses X Y are stored.

If an additional write command has been issued for the address X, the write pointer information of the CBP-1 is referred to. If an additional write command has been issued for the address Y, the write pointer information of the CBP-2 is referred to. Thereby, additional write for the non-volatile storage apparatus is enabled.

Specifically, if the number of clean block points to be provided is increased, write point information about more memory areas can be stored. Thus, additional write operations can be efficiently carried out in association with write addresses issued with a higher degree of randomness.

As regards the example of FIGS. 6B to 6C, when one clean block pointer is provided, the number of areas to be used is four and six write operations are needed in the case of the write commands shown in FIG. 6B. On the other hand, when two clean block pointers are provided, the number of areas to be used is two and four write operations are performed.

In the above-described embodiments, the clean block pointer is provided in the temporary storage medium. Alternatively, the clean block pointer may be provided in the non-volatile memory device.

Figure 7:
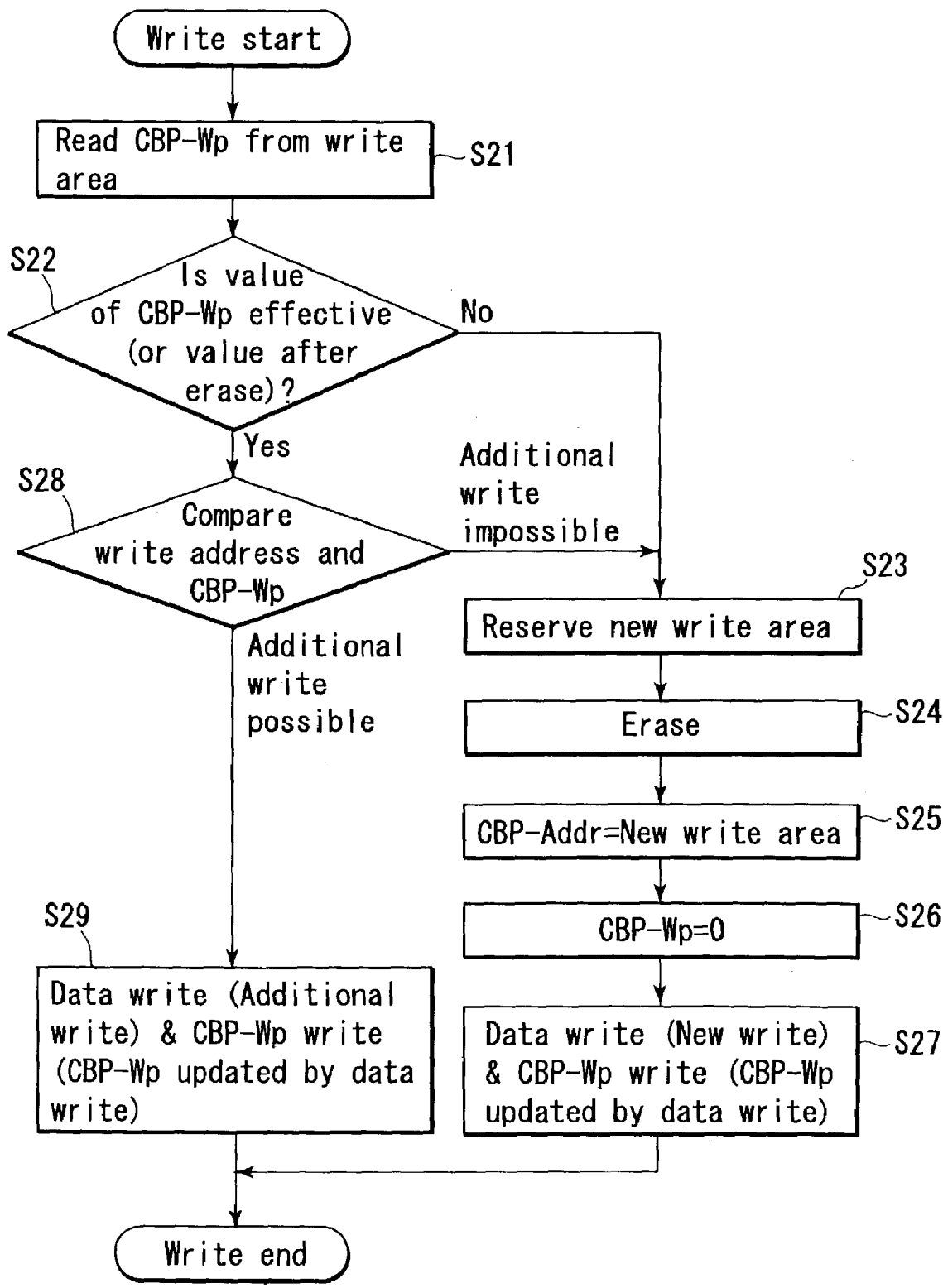
FIG. 7 is a flow chart illustrating the operation in the case where the clean block pointer is provided in the non-volatile memory device.

Referring to a flow chart of FIG. 7, a description will now be given of the operation in the case where the clean block pointer is provided in the non-volatile memory device.

Assume that the clean block pointer, together with write data, is provided in the non-volatile memory device. FIG. 7 is the flow chart of the write operation.

This example differs from the case where the clean block pointer is provided in the temporary storage medium in that the clean block pointer in the non-volatile memory device is first read at the time of starting the write operation, and that clean block pointer information is written at the same time as the write of data in the non-volatile memory device.

At the beginning of the data write, the clean block pointer is read from the address in the non-volatile memory device corresponding to a write block address issued from the host (S21). It is understood that if no data is written at the address, values after erase such as "0" or "1" are stored in all areas, and that the value of the clean block pointer is stored after write. Based on the value of the clean block pointer, it can be confirmed whether data is written at the address or not.

In this manner, whether the value of the clean block pointer is effective or not is determined (S22). If the value is not effective, that is, if the value after erase is not stored, a new write area is reserved (S23) and an erase process for the new write area is executed (S24).

Next, the address of the new write area is stored as the erase block address included in the clean block pointer (S25), and value "0" is stored as the write enable pointer in the clean block pointer (S26).

Thereafter, data (for new write) and the clean block pointer are written (S27), and the write enable pointer is updated.

On the other hand, if it is determined in step S22 that the value of the clean block pointer is effective, the write address is analyzed and the possibility/impossibility of additional write is determined, similarly with the case where the clean block pointer is stored in the temporary storage medium (S28).

Specifically, the write address is compared with the erase block address of the clean block pointer. If these addresses do not coincide, it is determined that additional write is impossible and the process in step S23 is executed.

If the addresses coincide in step S28, it is determined that additional write is possible, and data (for additional write) and the clean block pointer are written (S29), and the write enable pointer is updated. The clean block pointer is read and referred to, when the next write operation is performed at this address.

As has been described above, since the clean block pointers are stored in the non-volatile memory device, all erase block addresses can be provided with the same number of clean block pointers. Thereby, even if additional write is performed at any erase block address, there is no need to shift the existing data and high-speed processing is realized.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An information storage apparatus having a non-volatile memory device in which a data erase block is larger than a data write block, the apparatus comprising:
   erase means for effecting erase in the non-volatile memory device on the basis of a write command from a host;
   a clean block pointer that stores an address of an erase block in the non-volatile memory device, which is erased by the erase means, and information indicative of a position of a write block in the erase block, up to which data is written;
   determination means for determining, based on the clean block pointer, whether data associated with the write command is writable in the erase block in the non-volatile memory device in addition to other data already written in the erase block;
   write means for writing the data associated with the write command in the erase block, when the determination means determines that the data is writable;
   means for reserving other erase block when the determination means determines that the data is not writable;
   means for copying the other data already written in the erase block to the reserved other erase block; and
   means for writing the data associated with the write command in the reserved other erase block.

2. The information storage apparatus according to claim 1, wherein the clean block pointer is stored in a temporary storage medium provided separate from the non-volatile memory device.

3. The information storage apparatus according to claim 1, wherein the clean block pointer is stored, along with the data associated with the write command, in the non-volatile memory device.

4. The information storage apparatus according to claim 1, wherein the determination means comprises:
   first determination means for determining whether a write address associated with the write command coincides with the address of the erase block; and
   second determination means for determining whether the data associated with the write command is writable in the erase block, on the basis of the clean block pointer in addition to the other data already written in the erase block, when the first determination means determines that the write address associated with the write command coincides with the address of the erase block.

5. The information storage apparatus according to claim 1, wherein an address of the other data already written in the erase block corresponds to an address of the write command.

6. An information storage apparatus having a non-volatile memory device in which a data erase block is larger than a data write block, the apparatus comprising:
   erase means for erasing the non-volatile memory device on the basis of a write command from a host;
   a first clean block pointer that stores an address of a first erase block in the non-volatile memory device, which is erased by the erase means, and information indicative of a position of a write block in the first erase block, up to which data is written;
   a second clean block pointer that stores an address of a second erase block in the non-volatile memory device, which is erased by the erase means, and information indicative of a position of a write block in the second erase block, up to which data is written;
   determination means for determining, when data associated with the write command is to be written in the first erase block, whether the data associated with the write command is writable in the first erase block, on the basis of the first clean block pointer in addition to other data already written in the first erase block, and determining, when data associated with the write command is to be written in the second erase block in addition to other data already written in the second erase block, whether the data associated with the write command is writable in the second erase block, on the basis of the second clean block pointer; and
   write means for writing the data in the first erase block, when the determination means determined that the data is writable in the first erase block, and writing the data in the second erase block, when the determination means determines that the data is writable in the second erase block;
   means for reserving other erase block when the determination means determines that the data is not writable in one of the first erase block and second erase block;
   means for copying the other data already written in one of the first erase block and the second erase block to the reserved other erase block; and
   means for writing the data associated with the write command in the reserved other erase block.

7. The information storage apparatus according to claim 6, wherein the first and second clean block pointers are stored in a temporary storage medium provided separate from the non-volatile memory device.

8. The information storage apparatus according to claim 6, wherein the first and second clean block pointers are stored, along with the data associated with the write command, in the non-volatile memory device.

9. The information storage apparatus according to claim 6, wherein an address of the other data already written in the first erase block corresponds to an address of the write command and an address of the other data already written in the second erase block corresponds to the address of the write command.

10. A data write method in an information storage apparatus having a non-volatile memory device in which a data erase block is larger than a data write block, and a clean block pointer that stores an address of an erase block in the non-volatile memory device and information indicative of a position of a write block in the erase block, up to which data is written, the method comprising:
   erasing the non-volatile memory device on the basis of a write command from a host;
   determining, based on the clean block pointer, whether data associated with the write command is writable in the erase block in the non-volatile memory device in addition to other data already written in the erase block;
   writing the data associated with the write command in the erase block, when it is determined that the data is writable;
   reserving other erase block when the determination means determines that the data is not writable;
   copying the other data already written in the erase block to the reserved other erase block; and
   writing the data associated with the write command in the reserved other erase block.

11. The data write method according to claim 10, wherein the determination step comprises:
   determining whether a write address associated with the write command coincides with the address of the erase block; and determining whether the data associated with the write command is writable in the erase block in addition to other data already written in the erase block, on the basis of the clean block point, when it is determined that the write address associated with the write command coincides with the address of the erase block.

12. The data write method according to claim 10, wherein an address of the other data already written in the erase block corresponds to an address of the write command.

* * * * *